(12) United States Patent
Beaudry

(10) Patent No.: US 11,934,091 B1
(45) Date of Patent: Mar. 19, 2024

(54) PHOTOLITHOGRAPHY MASK AND PHOTOLITHOGRAPHY SYSTEM COMPRISING SAID PHOTOLITHOGRAPHY MASK

(71) Applicant: TECHNOLOGIES DIGITHO INC., Granby (CA)

(72) Inventor: Richard Beaudry, Granby (CA)

(73) Assignee: TECHNOLOGIES DIGITHO INC., Granby (CA)

( * ) Notice: Subject to any disclaimer, the term of this patent is extended or adjusted under 35 U.S.C. 154(b) by 0 days.

(21) Appl. No.: 18/263,105

(22) PCT Filed: Mar. 31, 2022

(86) PCT No.: PCT/CA2022/050491
§ 371 (c)(1),
(2) Date: Jul. 26, 2023

(87) PCT Pub. No.: WO2023/004493
PCT Pub. Date: Feb. 2, 2023

Related U.S. Application Data

(60) Provisional application No. 63/203,499, filed on Jul. 26, 2021.

(51) Int. Cl.
G03F 1/00 (2012.01)
G03F 7/00 (2006.01)

(52) U.S. Cl.
CPC ............ *G03F 1/00* (2013.01); *G03F 7/70291* (2013.01); *G03F 7/70991* (2013.01)

(58) Field of Classification Search
CPC ..... G03F 1/00; G03F 7/70291; G03F 7/70991
USPC ............................................................. 430/5
See application file for complete search history.

(56) References Cited

U.S. PATENT DOCUMENTS

| | | | |
|---|---|---|---|
| 6,251,550 B1 | 6/2001 | Ishikawa | |
| 6,379,867 B1 | 4/2002 | Mei et al. | |
| 6,544,698 B1 | 4/2003 | Fries | |
| 6,831,768 B1 | 12/2004 | Cebuhar et al. | |
| 2004/0051855 A1 | 3/2004 | Cooper et al. | |
| 2005/0151953 A1 | 7/2005 | Sewell | |

FOREIGN PATENT DOCUMENTS

| | | |
|---|---|---|
| DE | 19932488 A1 | 2/2001 |
| DE | 102004026019 A1 | 12/2005 |
| WO | 1991010170 A1 | 7/1991 |
| WO | 2021133112 A1 | 7/2021 |

*Primary Examiner* — Christopher G Young
(74) *Attorney, Agent, or Firm* — LAVERY, DE BILLY, LLP; Gonzalo Lavin

(57) ABSTRACT

A photolithography mask (10) is provided, said photolithography mask (10) including a plate (15) or an empty frame matrix, a surface of the plate (15) or empty frame matrix including an array of micro-pixels (20), wherein each micro-pixel (20) is independently controllable using an on-board micro-controller (25) in such a manner that a pattern can be generated with the array of micro-pixels (20).

20 Claims, 13 Drawing Sheets

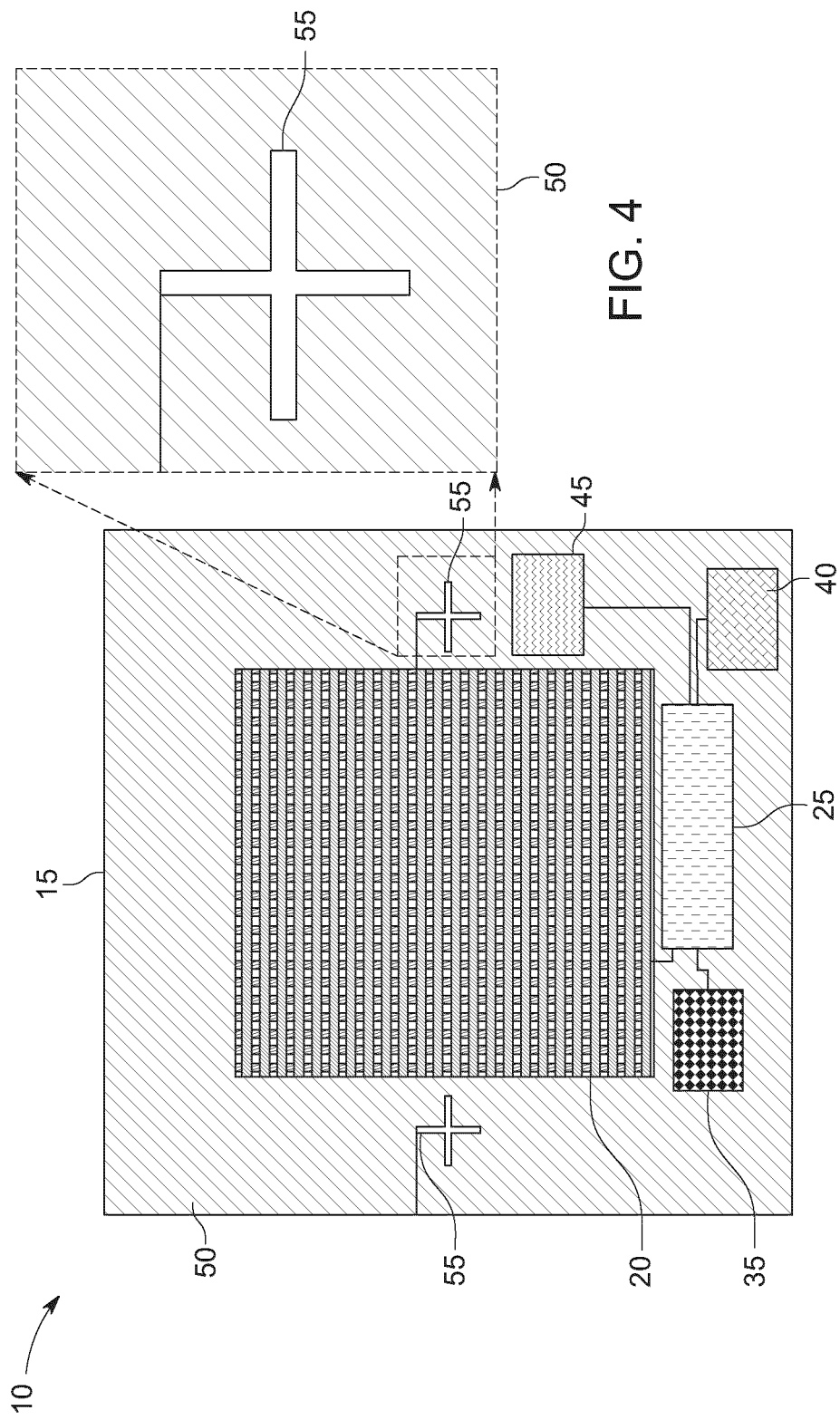

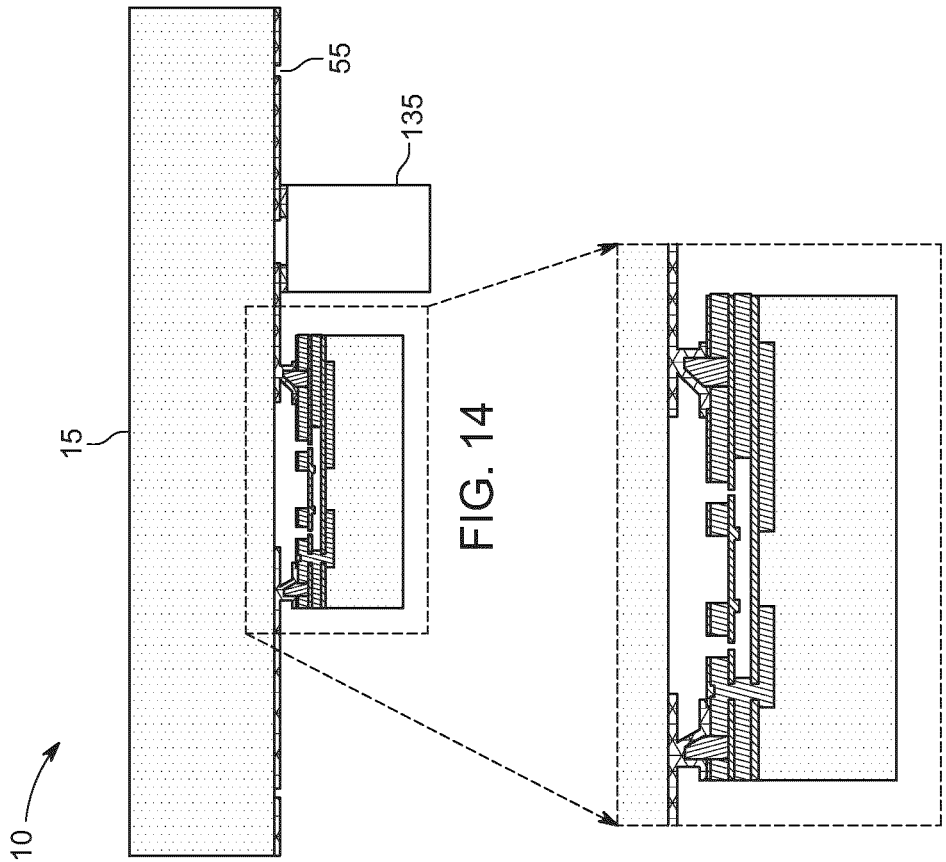
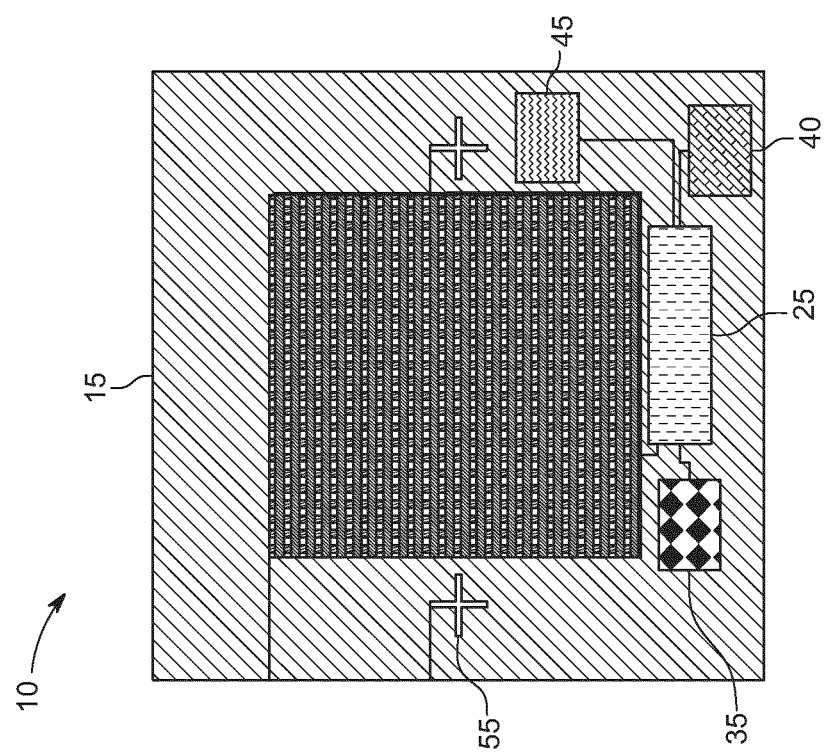

PHOTOLITHOGRAPHY MASK AND PHOTOLITHOGRAPHY SYSTEM COMPRISING SAID PHOTOLITHOGRAPHY MASK

CROSS-REFERENCE TO RELATED APPLICATIONS

This application is a National Entry Application of PCT application No. PCT/CA2022/050491 filed on Mar. 31, 2022 and published in English under PCT Article 21(2), which itself claims benefit of U.S. provisional application Ser. No. 63/203,499, filed on Jul. 26, 2021. All documents above are incorporated herein in their entirety by reference.

FIELD OF THE INVENTION

The present invention relates to a photolithography mask and photolithography system comprising said photolithography mask.

BACKGROUND OF THE INVENTION

In the field of photolithography, conventional photolithography masks are generally made of transparent material (usually glass) in the shape of a plate which is coated by an opaque film (often chromium) on some portion of the plate. This opaque film blocks light at determined areas on the mask such that light is only transmitted through certain areas of the mask. The transmitted light is then focused on the desired medium (usually a photo-sensitive resist, in the form of a film, on a substrate) to alter it. The photolithography process aims to transfer an image made by the pattern on the mask (made by the opaque film on the glass plate) to the photo-sensitive film on the substrate that one wishes to alter. This transfer is done through a set of optical lenses or simply by having the mask physically in contact with or in proximity to the substrate with photo-sensitive film. The photo-sensitive film is then developed by a process which dissolves the exposed area (in the case of a positive tone resist) or dissolves the non-exposed area (in the case of a negative tone resist) of the photosensitive film. This leaves the substrate with film only on the desired area (the image of the photolithography mask). The substrate areas left without film can then be altered in a subsequent process. This is the basic concept of micro-fabrication or semiconductor fabrication. However, this process can also be used for other fabrication processes. Photolithography is therefore printing the pattern from the photolithography mask onto the desired substrate. This process is then repeated with different masks in order to alter each region of the device in order to fabricate the complete micro-device.

Each unique pattern requires its unique photolithography mask. This is the main disadvantage of conventional photolithography processes, where a new mask has to be made for each new pattern.

FIG. 1 shows an example of a conventional photolithography system. A light source 1, producing light that follows optical path 2, is focused through a lens 3 onto a photolithography mask 4. An image is generated from the transparent area of the photolithography mask 4 and then travels through a series of lenses in an optical column 5. The magnification of the image can be changed during this step. The image is then projected onto the surface of the substrate 6 at the exit of the optical column. The substrate 6 has a photosensitive film (photosensitive photoresist) at its surface. The exposed zones of the photosensitive resist are altered. The film can be developed in a subsequence step to reveal the transferred pattern. The alignment stage 7 allows alignment of the substrate 6 to transfer the pattern to the desired location on the substrate 6. It is moved before each exposure. The light source 1 and the alignment stage 7 are controlled using a photolithography equipment controller 8. Sometimes, the optical column is not present in the system and the image is directly transferred to the substrate 6. In such cases, the mask is in close proximity with the substrate 6.

FIG. 2 shows an example of a conventional photolithography mask, comprising a plate 9 with an opaque film 11 and a transparent area 12. Alignment marks 13 may be present to provide features for aligning the pattern into an existing pattern already present on the substrate 6 or to leave marks on the substrate 6 that will help subsequent lithography steps to be aligned therewith. An area of a pattern to be transferred is shown using the dotted line labelled with numerical reference 14.

Some lithography techniques do not use masks, but instead use a scanning beam or a pulsed beam to alter the desired region of the resist. The beam can be a beam of photons (light), electron or ion. This is commonly referred to as mask-less lithography. In these techniques, digitalized files including pattern coordinates of the pixels provide a way to directly write the pattern on the resist without intermediate steps (e.g. without the use of a stencil). This only allows one to generate the pattern in the resist one pixel at a time.

Current mask-less lithography processes need to repeat the sequence of pulses in order to repeat the same pattern and need to convert the digital file into a physical pattern every time.

Printing (such as inkjet printing) is also a method that can directly transfer a digital file containing pattern coordinates into a pattern on a substrate 6.

SUMMARY OF THE INVENTION

In accordance with the present invention, there is provided a photolithography mask comprising a plate or an empty frame matrix, a surface of the plate or empty frame matrix comprising an array of micro-pixels, wherein each micro-pixel is independently controllable using an on-board micro-controller in such a manner that a pattern can be generated with the array of micro-pixels.

BRIEF DESCRIPTION OF THE DRAWINGS

FIG. 3 is a top view of a photolithography mask according to an embodiment of the present invention;

FIG. 4 is a close-up top view of the area enclosed with dotted lines in FIG. 3.

FIG. 13 shows a top view of an array of micro shutters according to an embodiment of the present invention.

FIG. 14 shows a cross-sectional view showing one pixel of the array of micro shutters shown in FIG. 13.

FIG. 15 is a close-up of the area enclosed with dotted lines in FIG. 14.

DETAILED DESCRIPTION OF THE ILLUSTRATIVE EMBODIMENTS

Photolithography Mask

Figure 1:
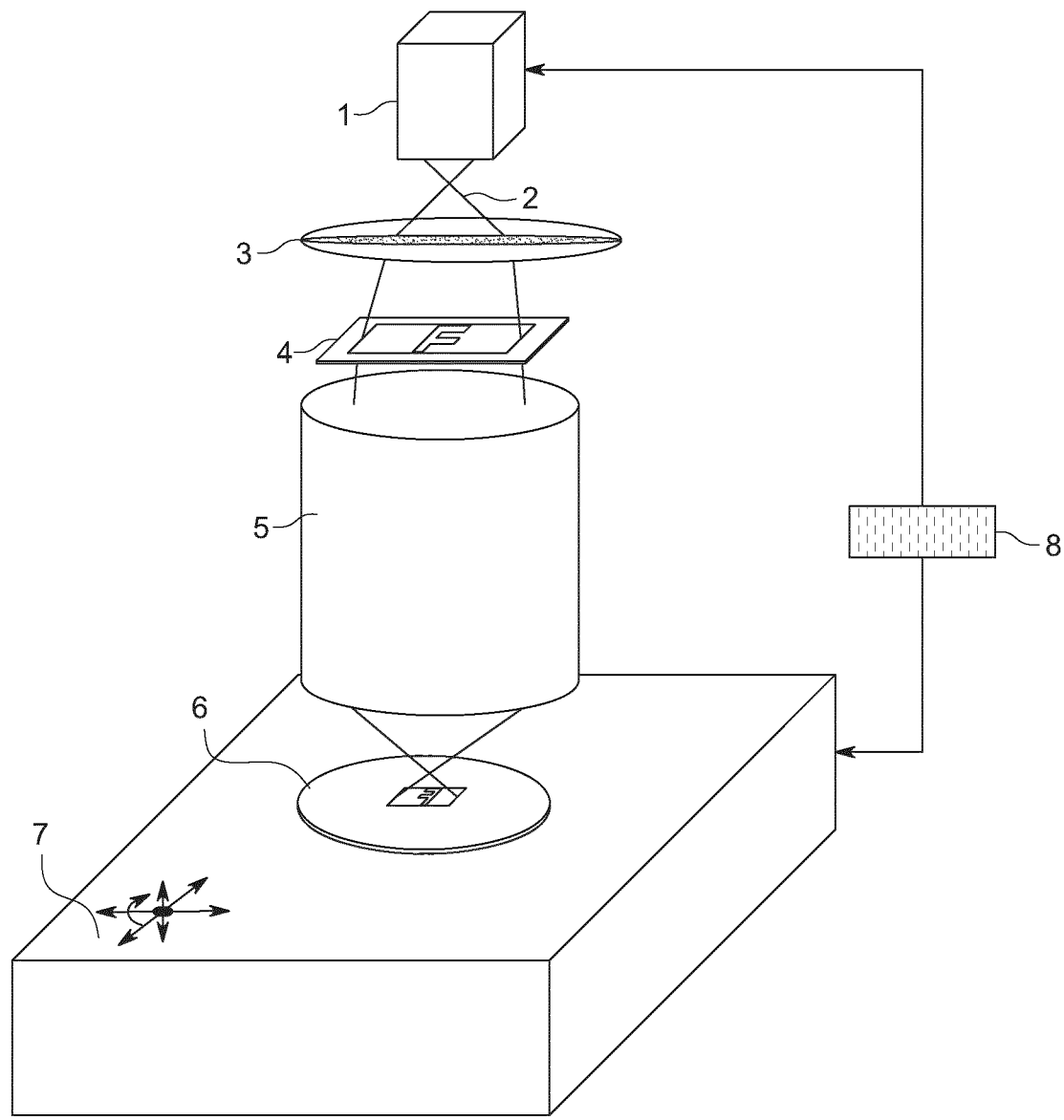
FIG. 1 is a schematic of a conventional photolithography system comprising a conventional photolithography mask used in the prior art.
Figure 2:
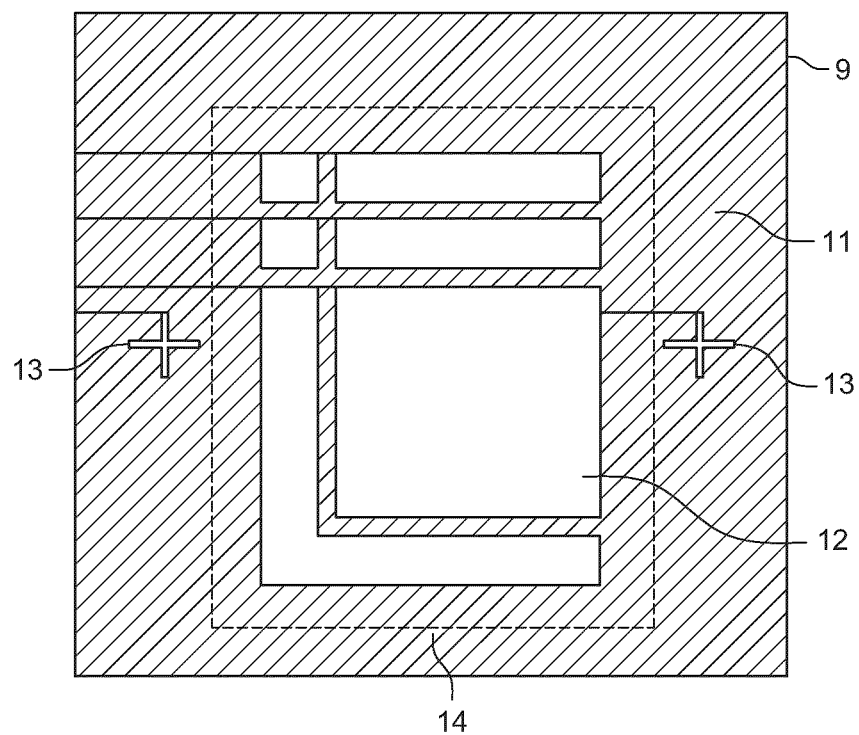
FIG. 2 is a top view of a conventional photolithography mask used in the prior art.

In a first aspect of the present invention, a photolithography mask is provided. The present inventors discovered that by using a digitally controlled array of actuatable micro-shutters on a photolithography mask, one can generate patterns on demand; in fact, in embodiments, this digital photolithography mask can be alternatively used in place of and in the same manner as conventional photolithography masks in conventional photolithography equipment with only a few installation steps. In embodiments, the digitally adaptable photolithography mask of the present invention contains on-board electronics that allow the operator of the photolithography equipment to generate the desired digital pattern on demand.

The mask of the present invention can include a plate that is similar in size to a traditional photolithography mask, meaning it can be used in place of conventional masks and it can be used for the same purpose of reproducing an image of a pattern on a substrate. However, the plate of the photolithography mask of the invention comprises areas with an array of micro-pixels. Each micro-pixel is made of a micro-shutter that can be set to transmit light or not through the mask (or set to a partial transparency level). The actuation of the micro-shutters can be controlled by an on-board micro-controller on the plate. The desired image of a pattern is therefore generated when the shutters across the array are set to ON or to OFF in a predetermined manner. This means a variety of patterns can be generated with a combination of settings for the ON or OFF state of the pixels.

The on-board micro-controller can communicate with a master controlling system (master controller) that communicates the information about what pattern to set up and when the pattern should be set up. The master controller allows for a synchronization with the operation of the photolithography equipment and the digital photolithography mask of the present invention. Specifically, the master controller allows for synchronization of actions of the photolithography mask (such as actuating micro-shutters) to actions of a photolithography system (such as controlling the alignment stage) as per a sequence of commands (said commands including which micro-shutters to actuate, and when).

The digitally adaptable photolithography mask of the present invention may further include a sensor to detect photolithographic exposure or, alternatively, a signal can be sent to the on-board micro-controller to inform the photolithography mask that an exposure is occurring. Depending on the pre-programmed operation plan, the micro-controller will change or not the micro-shutter array to the next pattern.

As will be discussed in more detail below, the micro-shutters can be made of a moveable membrane of high refractive index facing a film of similar refractive index (of refractive index higher than air for the operational light wavelength), where the actuation mechanism varies the distance in between the two refractive films such that it alters the transparency and reflectivity of the optical cavity. The highest transmission setting corresponds to the ON state and the lowest transmission setting corresponds to the OFF state of the shutter. Intermediate settings could be used for imaging with intermediate light intensity pixels on the image pattern. Alternatively, an ON/OFF digital signal can be sent to the desired pixels, at a pre-determined frequency and duty cycle, in such a way that the total optical dose is altered during the exposure time. This is an alternative way to generate an intermediate setting.

Referring first to FIG. 3, a photolithography mask, generally referred to using the reference numeral 10, will be described. As mentioned, embodiments of the present invention relate to a photolithography mask on which pattern formations are electronically controlled to locally block or not light directed to go through it.

In preferred embodiments, the photolithography mask is dimensioned such that it can be used in place of conventional photolithography masks in existing photolithography equipment. Compared to conventional photolithography masks, the area of the mask with the pattern to be transferred instead comprises a matrix of pixels that can each be set to "transparent" or "opaque" on demand. Alternatively, the transparency level could be adjusted as desired in the range between the minimum and the maximum transparency level of the pixel.

In preferred embodiments, such as the photolithography mask 10 shown in FIG. 3, the photolithography mask 10 includes a transparent plate 15, and further includes:

an area comprising a matrix of active pixels (or shutters) 20 which can each independently be set to "transparent" or "opaque" on demand, thereby defining an array of micro-shutters 20;

an on-board microcontroller 25 to transfer the information regarding which pixels are to be transparent or opaque in order to set the right micro-shutters that will generate the desired pattern, wherein the micro-shutter array 20 is controlled by the on-board microcontroller 25, and where each micro-shutter pixel is set to be transparent or opaque by the microcontroller signal (and it is to be understood that each shutter can be set to transparent or opaque for the light wavelength used by the photolithography process); in embodiments, the micro-controller 25 includes a micro-processor and digital memory that contains files with pattern coordinates; the micro-shutter can be a micro-electro-mechanical system (MEMS);

a battery 35 to provide electrical power that allows for actuation and logic controls;

a communication port 40 that can receive the information from a photolithography equipment operator or from a master controller (controlling the photolithography equipment and the digital photolithography mask 10), which allows for the activation of the right pixels at the desired time to generate the desired pattern at the desired time; and a light detector, which can help synchronize the mask 10 for the exposure periods and the setting periods.

Each of these elements will now be described in more detail.

The plate 15 preferably has similar dimensions to a plate of a conventional photolithography mask, which allows users to place and align the photolithography mask 10 (according to an embodiment of the present invention) at the same location and in the same manner as a conventional mask. The plate 15 can be made of material which is transparent to the light wavelength of interest (wavelength used to alter the photo-sensitive resist in the photolithography process), preferably glass or quartz, as would be understood by the person of skill in the art.

As mentioned, the photolithography mask 10 in FIG. 3 further includes an array of actuated micro-shutters 20; each micro-shutter 20 allows the light to pass or not through each pixel of the array in such a way to generate the desired pattern.

The photolithography mask 10 in FIG. 3 further includes an on-board micro-controller 25 (which can include a micro-computer with a micro-processor and digital memory) that is operatively connected to the array of micro-shutters 20. The on-board micro-controller 25 is also connected to a battery 35 for supplying power thereto. The micro-controller 25 is also operatively connected to a communication port 40 for communicating with a master controller 65 (shown in FIG. 5). The micro-controller 25 is also operatively connected to an exposure sensor 45 for sensing when the photolithography exposure occurs. The micro-controller 25 sets the actuation signal for each pixel at the desired time of execution in the photolithography sequence.

Due to the presence of the microcontroller 25, the photolithography mask 10, in accordance with embodiments of the present invention, can be computer controllable. A micro-electro-mechanical system (MEMS) may also be implemented into the photolithography mask 10 in such a way that the actuated micro-parts constitute micro-shutters (which can be opaque pixels when not actuated and transparent pixels when actuated or vice versa) that are controlled by the microcontroller 25 in order to become transparent or not as desired for processing the incoming light. The opaque pattern is then digitally controlled by computer and a large number of different patterns can be made with only one mask. In embodiments, this is an advantage over conventional photolithography technology where one photolithography mask generates only one pattern.

As mentioned, the photolithography mask 10 in FIG. 3 further includes a communication port 40, which is configured to link to a communication port of a master controller, discussed in more detail below.

As mentioned, in preferred embodiments, and as shown for example in FIG. 3, the photolithography mask 10 further includes an exposure sensor 45, which senses when the photolithography exposure occurs and sends the signal that it has occurred to the on-board micro-controller 25. Alternatively, when an exposure sensor is not present, the master controller could tell the on-board micro-controller 25 when the exposure occurs or not.

The photolithography mask 10 in FIG. 3 includes an opaque film 50 on the plate that defines transparent patterns (a transparent area of the plate with no opaque film, called alignment marks 55, seen more clearly in FIG. 4) made for alignment purposes. This is not actuated, and it allows for the alignment of many photolithography processes on the same substrate (in the same manner as with conventional alignment marks).

Figure 5:
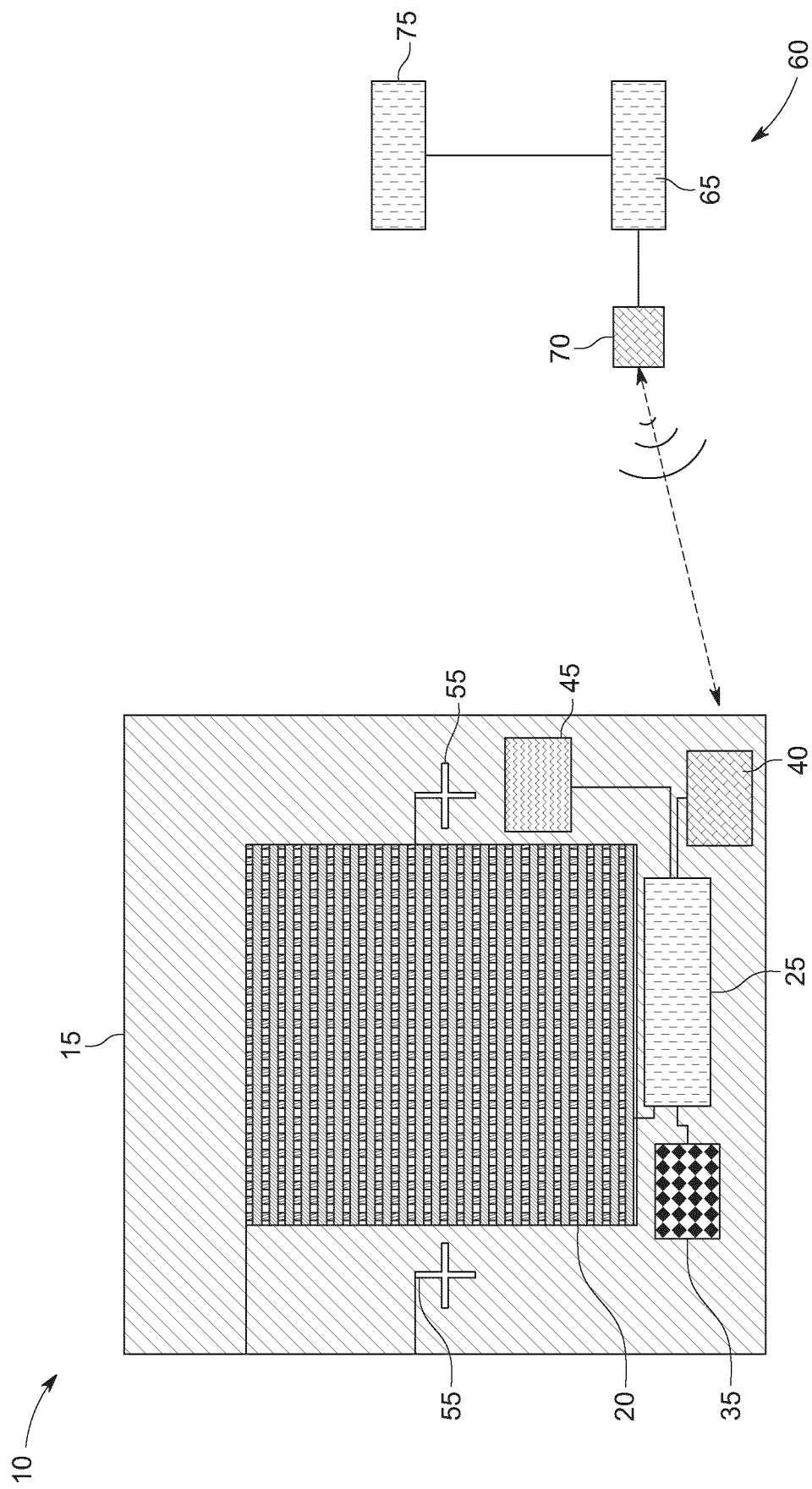
FIG. 5 is a schematic of a communication system and the photolithography mask of FIG. 3.

The photolithography mask 10 of FIG. 3 is configured to be able to communicate with a communication system 60, as shown for example in FIG. 5, which is a schematic of a communication system 60 and the photolithography mask 10 of FIG. 3. The communication system 60 of FIG. 5 includes a master controller 65, which sends the sequence of commands to the on-board micro-controller 25, as well as the patterns to be exposed. The master controller 65 may use its own communication port 70 to transmit this information to the on-board communication port 40 or to receive information from the on-board micro-controller 25 to adequately execute the sequence of steps.

For clarity, the communication port 70 of the communication system 60 is linked to the master controller 65, while the communication port 40 of the photolithography mask 10 is linked to the on-board micro-controller 25. They transmit the information between the master controller 65 and the onboard micro-controller 25. The communication ports 40, 70 could transmit the information through a transmission line or wirelessly. Optionally, there could be other communication ports linked to other apparatuses, that will transmit information to the controllers about other sensors or data.

As shown for example in FIG. 5, the master controller 65 sends information to the digital photolithography mask 10 and the photolithography equipment. This computer controller 65 can transmit the pattern files to the digital photolithography mask 10 and the information of when to set each pattern synchronously to the equipment actions. It also controls a photolithography equipment controller 75 to send information about how and when to execute photolithography sequences.

Figure 6:
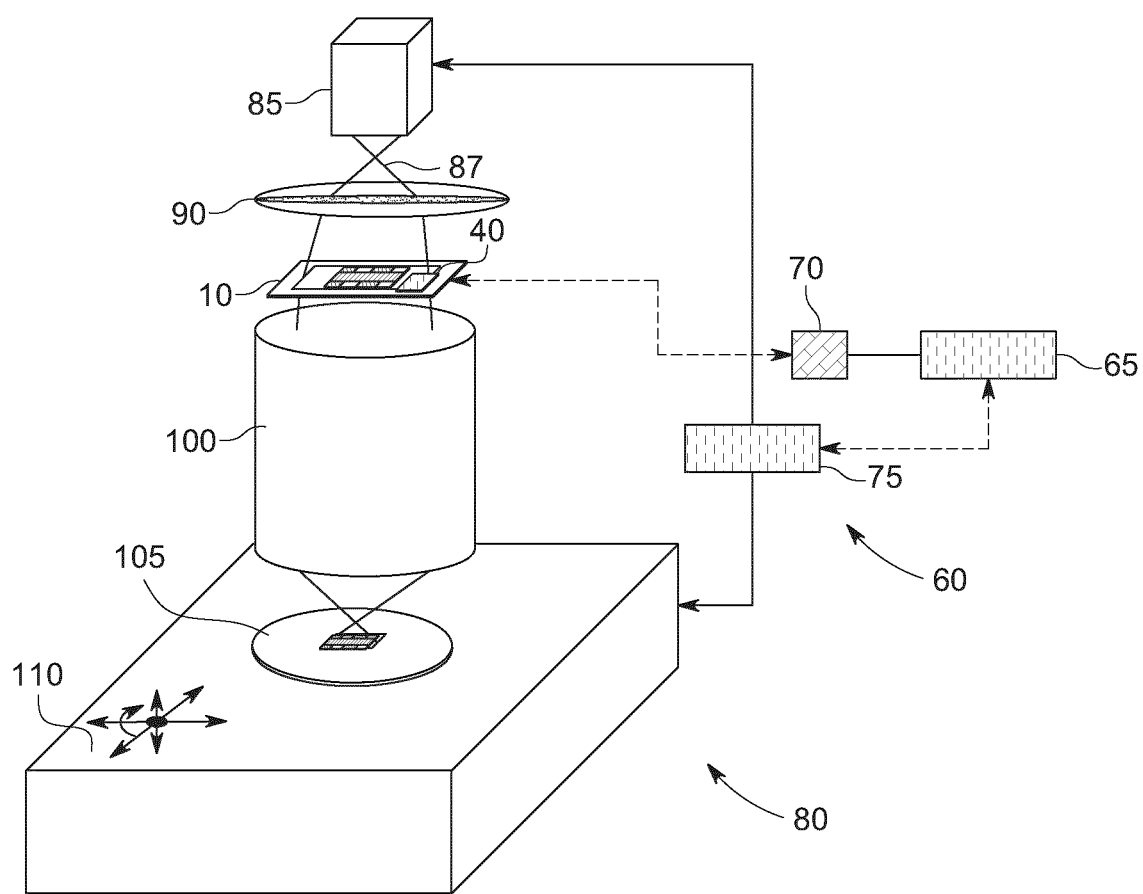
FIG. 6 is a schematic of a photolithography system comprising the photolithography mask of FIG. 3.

FIG. 6 is a schematic of a photolithography system 80 including the photolithography mask 10 of FIG. 3 and the communication system 60 of FIG. 5. Aside from the photolithography mask 10 and the communication system 60, the other equipment used in the system (e.g. the light source 85 with optical path 87, the lens 90, the optical column 100, the wafer 105, and the alignment stage 110) can be those used in conventional photolithography systems, as understood by the person of skill in the art.

Figure 7:
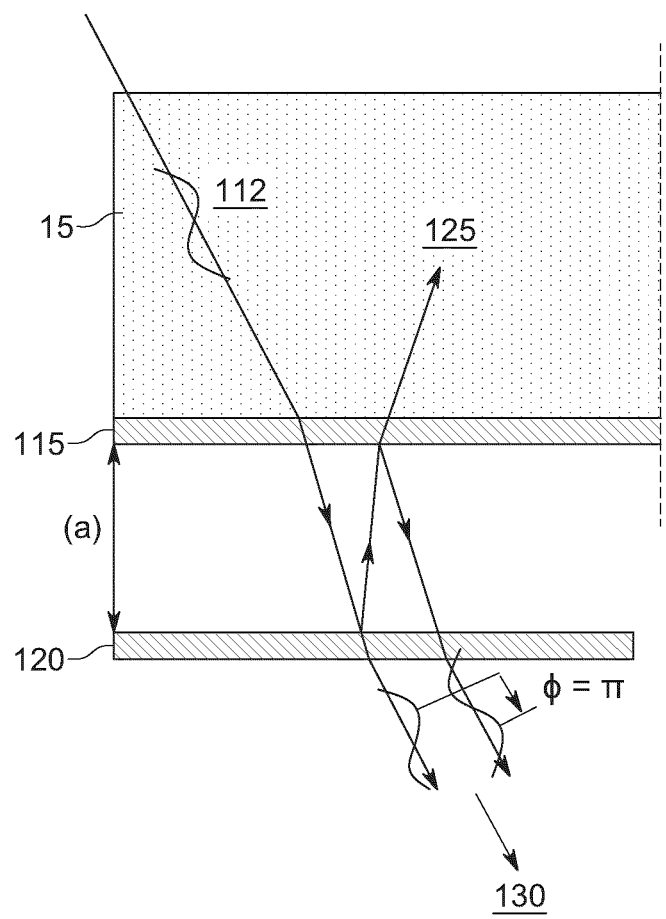
FIG. 7 is a cross-sectional side view of an example of a micro-shutter that can be used in the photolithography mask according to an embodiment of the present invention, showing the shutter in an "OFF" position.
Figure 8:
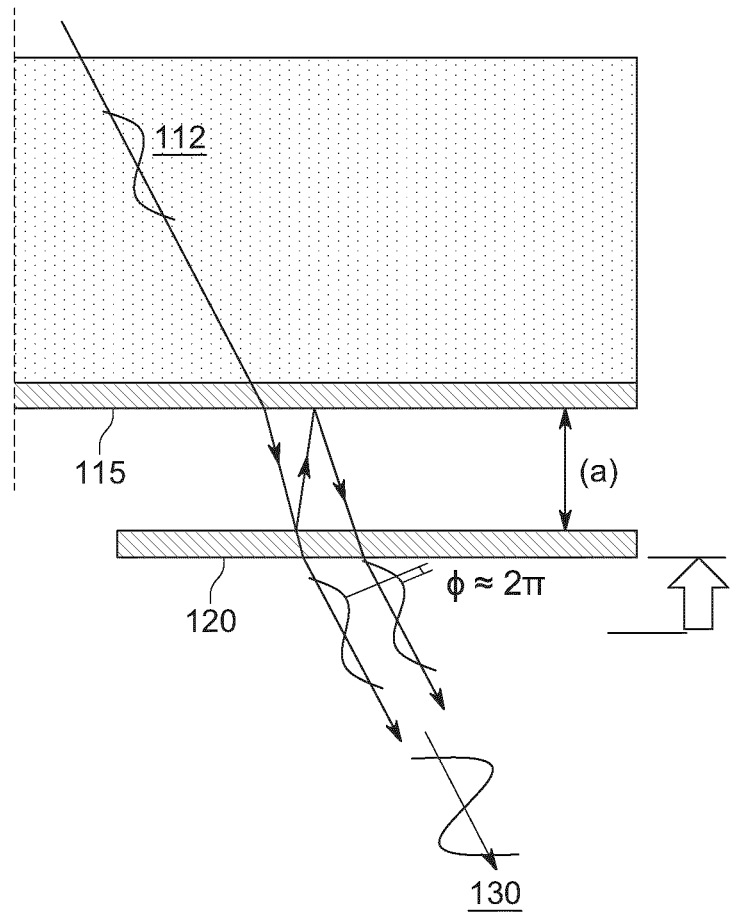
FIG. 8 is a cross-sectional side view of the micro-shutter of FIG. 7, showing the shutter in an "ON" position.

FIGS. 7 and 8 show a manner in which the micro-shutters 20 used in the photolithography mask 10 (according to embodiments of the present invention) can work using Fabry-Perot interferometers (or any other type of Optical Cavities). Specifically, the mask may include a plurality of material films that can be altered in such a way to become transparent or opaque to the radiation involved in the photolithography process using Fabry-Perot interferences. The skilled person would understand that other types of optical cavities could be used.

Light (or rather, photon EM waves, 112) travels through the transparent plate 15 and reaches a film 115 with higher refractive index than the plate 15. The light travels through this film 115 and an air gap up to a second high refractive index film 120. Together, the film 115, the air gap, and the film 120 constitute a Fabry-Perot interferometer. The second film 120 is actuated by or is part of a MEMS device (not shown) that can change the Fabry-Perot interferometer dimension by changing the distance (a) between the two high refractive index films 115 120. If the actuation of the second film 120 is such that transmission through the Fabry-Perot interferometer is minimum (as the transmitted light 130 experiences destructive or annulling interference, meaning $\varphi=\pi$), the "OFF" condition (opaque mode) is achieved, where the light is mostly reflected back to the plate (reflected light being shown with numerical reference 125). Alternatively, the actuation can be such that transmission through the Fabry-Perot interferometer is maximum. This results in the "ON" state (actuated mode), where the light is mostly transmitted through the Fabry-Perot interferometer (said transmitted light 130 having experienced constructive interference, meaning $\varphi=2\pi$). Naturally, light is still transmitted even when $\varphi$ does not equal exactly $2\pi$; the skilled person would understand that constructive interference is at its highest when $\varphi=2\pi$, and that destructive interference occurs when $\varphi=\pi$, and that different levels of transmittance occur in between. In an alternative embodiment of the mask of the present invention, the transparency level of the pixel could be adjusted as desired to a set point in the range between the minimum and the maximum transparency level.

For clarity, the Fabry-Perot interferometer can cause double reflected light beams to interact with simply refracted beams such that destructive interference prevents light transmission at that wavelength. This is illustrated at FIG. 7. This sets the conditions to "OFF" for the exposing pixels. Conditions can be changed in the Fabry-Perot interferometer such that the optical path is modified, and destructive interference does not occur, and therefore transmission is no longer prevented. When phase difference is such that constructive interference occurs, transmission is maximum. This then sets the conditions to "ON" for the exposing pixels (as shown in FIG. 8). The optical path modification can be done by mechanical displacement of a membrane constituting the Fabry-Perot interferometer. Alternatively, it can be done by modifying the refractive index within the interferometer. For example, this can be done with liquid crystal, or electro-optic material. With a Fabry-Perot variable interferometer device, it is possible to set the interferometer at different dimensions such that most light transmission is minimal, maximal or any intermediate point in that range. This can be an advantage of the mask of the present invention over conventional photolithography processes, as this "gray scale control" can be varied on demand.

For the actuation of the second film 120, one can use MEMS-actuatable pixels where the film is held flat by a silicon frame. This frame provides rigidity, and electrical conductivity to be used as a parallel electrode that would be attracted to a similar conductive frame around the first refractive film. Silicon hinges in connection with the frame of the second film provide the repel force to distance the two films apart. This way, the distance can be controlled by controlling the attracting electric field between the two electrodes by varying the voltage between the two.

Figure 9:
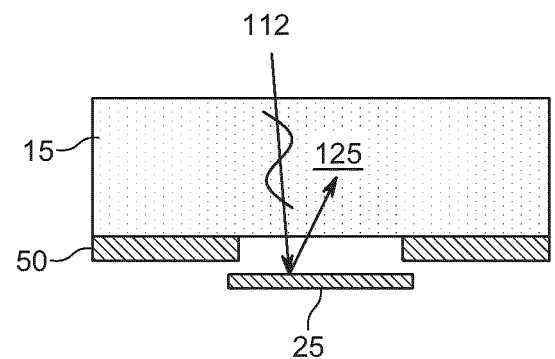
FIG. 9 is a cross-sectional side view of another example of a micro-shutter that can be used in the photolithography mask according to an embodiment of the present invention, showing the shutter in an "OFF" position.
Figure 10:
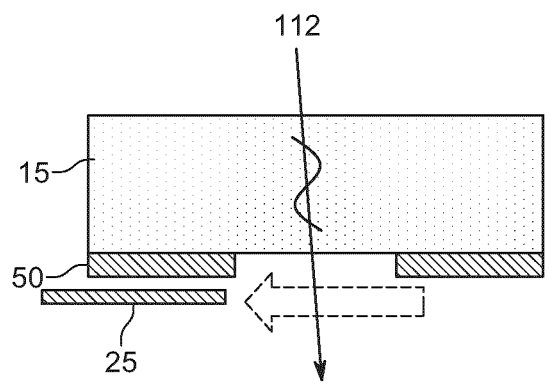
FIG. 10 is a cross-sectional side view of the micro-shutter of FIG. 9, showing the shutter in an "ON" position.
Figure 11:
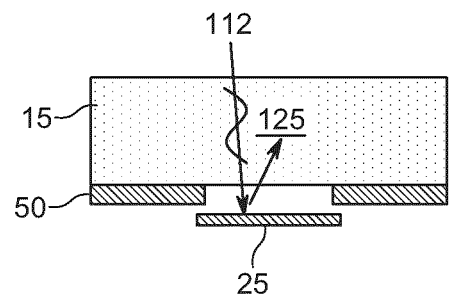
FIG. 11 is a cross-sectional side view of yet another example of a micro-shutter that can be used in the photolithography mask according to an embodiment of the present invention, showing the shutter in an "OFF" position.
Figure 12:
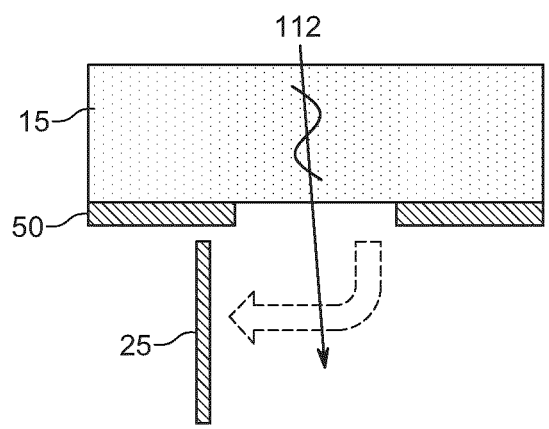
FIG. 12 is a cross-sectional side view the micro-shutter of FIG. 11, showing the shutter in an "ON" position.

Alternatively, the digitally adaptable photolithography mask can use MEMS-actuatable blocking pixels where an opaque film is set to block or open a window to let pass the radiation of interest. FIGS. 9-12 show two examples of alternatives of micro-shutters 25, wherein the mask includes a transparent material 15 and an opaque material 50. One option is an actuatable opaque shutter 25 that is moved laterally when actuated (as shown in FIGS. 9 and 10). Another option is an actuatable opaque shutter 25 that gets an off-plane rotation when actuated (as shown in FIGS. 11 and 12). The pixel-like elements made of micro-shutters could have dimensions from a few nanometers to hundreds of microns.

In preferred embodiments, in the case of rectangular micro-shutters, each of the length and width of each micro-shutter is at least about 5 nm, at least about 50 nm, at least about 500 nm, at least about 1 micron, at least about 2 microns, or at least about 2.5 microns and/or at most about 500 microns, at most about 100 microns, at most about 50 microns, at most about 20 microns, at most about 10 microns, or at most about 5 microns.

In more preferred embodiments, the micro-shutters have the same length and width (meaning each micro-shutter is mostly square-shaped). In even more preferred embodiments, each micro-shutter has a dimension of between about 5 nm×5 nm and about 500 microns×500 microns, yet even more preferably 1 um×1 um, 2.5 um×2.5 um, or 5 um×5 um.

In embodiments, all micro-shutters in the array have the same dimensions. In alternative embodiments, the micro-shutters can have different and/or the same dimensions as other micro-shutters in the array.

The micro-shutters allow the transmitting or blocking of photons (as the shutter is displaced). For example, each micro-shutter can be made by a MEMS silicon structure where a slab held by hinges alters the optical path when electro-static combs attract the slab towards the controlling electrode or not. In the absence of an electro-static field, the hinge spring force repels the shutter at the equilibrium position (see, for Example, FIGS. 13-19, defined in more detail below). The examples in FIGS. 13-19 use electro-static MEMS actuation. Alternatively, the actuation could be done using piezoelectric actuation, magnetic actuation, pneumatic actuation or bimetal thermal expansion actuation.

It is worth noting that the photolithography mask 10 shown in FIG. 3 is a photolithography mask designed to be implemented into photolithography systems, which use photons (light beams).

In embodiments, such as those defined above, the digital mask of the present invention is a 2D matrix used in transmission. Alternatively, the same principle could be used for photolithography masks designed to be used in reflection. In such a design, each pixel is designed to reflect or not the light on demand.

Photolithography System Including Photolithography Mask

In a second aspect of the present invention, a system including the above-defined mask and the above-defined communication system is provided.

In embodiments, said system is as shown in FIG. 6. However, the skilled person would understand that any photolithography system can be used with the mask of the present invention, so long as the mask and the communication system are properly adjusted so as to function with said system.

To fabricate the embodiments shown in, for example, FIGS. 13-19, the micro-shutter array can be bonded on a standard photolithography mask in a permanent manner (as shown in FIGS. 13-14, such as by anodic bonding, metal thermos-compression, eutectic bonding, adhesive film bonding, or any other suitable bonding methods. The electronic elements 135 (which include the on-board micro-controller 25, the battery 35, the communication port 40, and the exposure sensor 45) can then be bonded on the photolithography mask in a permanent manner (as shown in FIGS. 13-14, such as by using conductive paste printing, electronic chip placement and metal reflow. This completes the digitally adaptable photolithography mask. FIG. 15 is a zoom on the micro-shutter that illustrates the pixel in an "OFF" state where the Fabry-Perot cavity is such that minimal light is transmitted. This is the case when the top and bottom electrodes are at the same voltage and the distance between the 2 refractive layers of the Fabry-Perot is at a position of mechanical equilibrium (distance defined, for example, by the sacrificial layer thickness that was etched away). As mentioned, FIG. 13 shows a top view of an array of micro shutters according to an embodiment of the present invention, while FIG. 14 a cross-sectional view showing one pixel of the array of micro shutters shown in FIG. 13.

Figure 17:
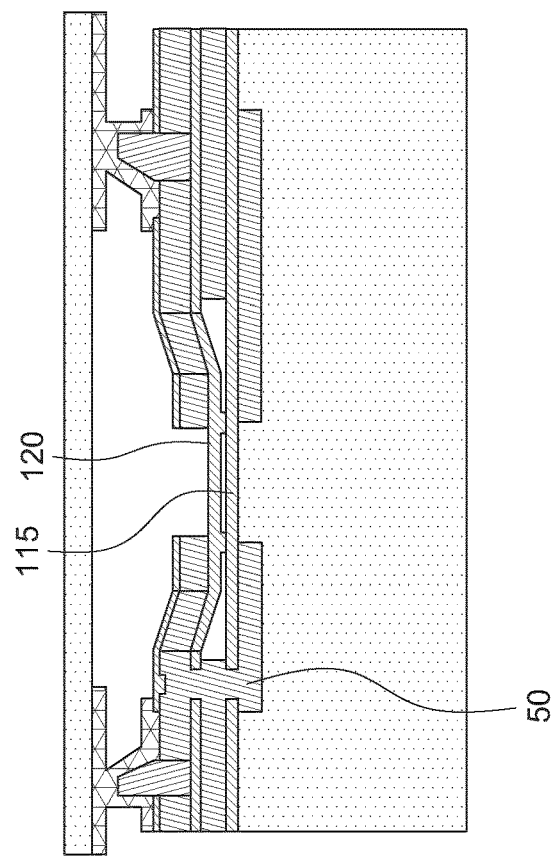
FIG. 17 shows a close-up of the cross-sectional view of the pixel of FIG. 14 in an active (ON) position.
Figure 16:
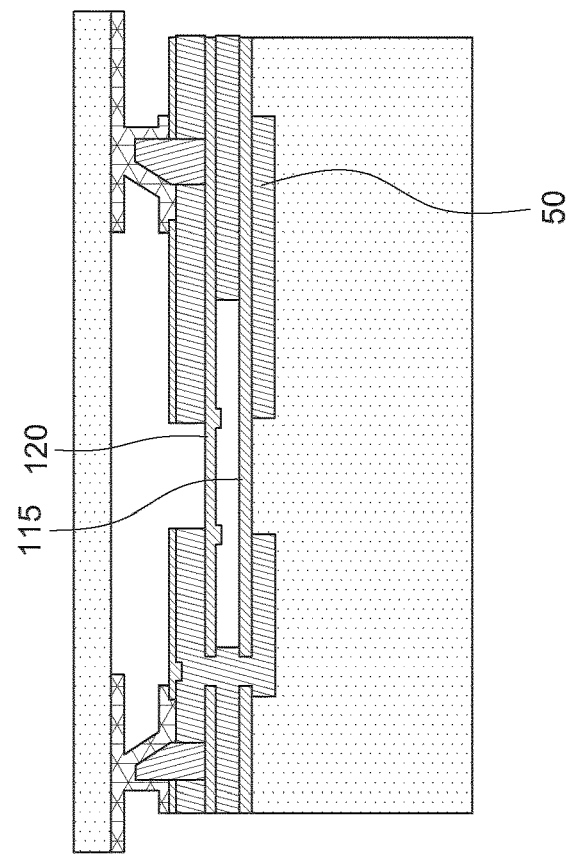
FIG. 16 shows a close-up of the cross-sectional view of the pixel of FIG. 14 in a non-active (OFF) position.

FIG. 16 shows a close-up of the cross-sectional view of the pixel of FIG. 14 in a non-active (OFF) position. FIG. 17 shows a close-up of the cross-sectional view of the pixel of FIG. 14 in an active (ON) position. In this example, the optical cavity (in this case, the Fabry-Perot interferometer) is altered using electrostatic actuation in combination with repelling hinges.

Figure 18:
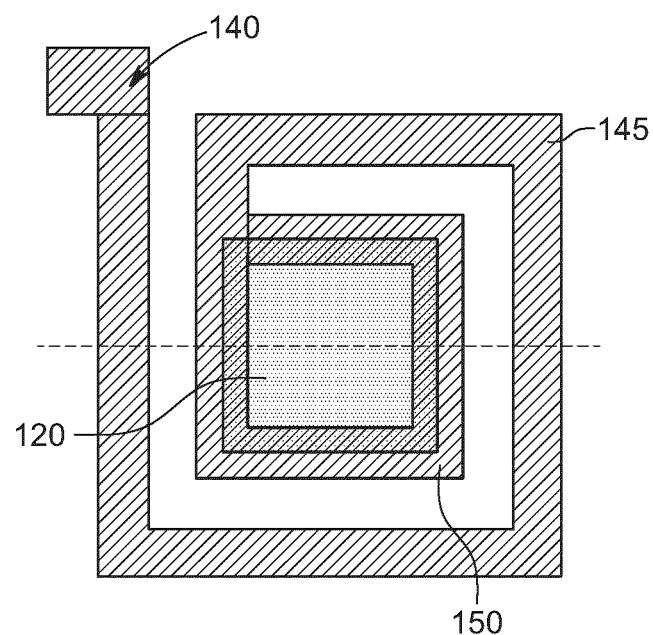
FIG. 18 shows a top view of an example of a micro-shutter that can be used in the photolithography mask according to an embodiment of the present invention.

FIG. 18 shows a top view of an example of a micro-shutter that can be used in the photolithography mask according to an embodiment of the present invention. Specifically, FIG. 18 shows the top few of a possible MEMS design including an anchor point 140, a hinge 145, the membrane 120, supporting frame 150, and electrodes 155 (shown in FIG. 19) of the actuatable micro-shutter. For clarity, the supporting frame 150, which is electrically conductive and can be made of, for example, silicon or silicon carbide, is a frame that holds the membrane, much like the silicon frame mentioned above when discussing FIGS. 7 and 8. This supporting frame 150 is not the same as the plate or empty frame matrix mentioned above when describing the overall photolithography mask.

Figure 19:
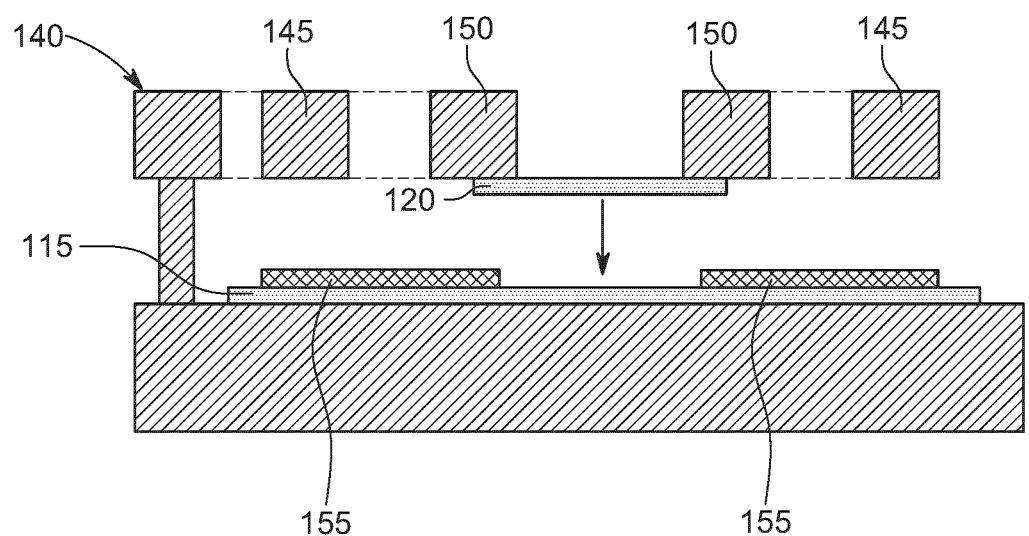
FIG. 19 shows a cross-sectional side view of the micro-shutter of FIG. 18.

FIG. 19 shows a cross-sectional side view of the micro-shutter of FIG. 18. Specifically, FIG. 19 shows the electrodes 155 that can attract the supporting frame 150 and move the membrane 120 closer to the electrodes 155 using an electric field.

Advantages

In embodiments, in addition to the advantages previously discussed, the photolithography mask of the present invention, as well as the system of the present invention, can present one or more of the following advantages.

In embodiments, the photolithography mask of the present invention can greatly reduce development time because it removes the necessity to fabricate a new physical mask for every layout modification.

In embodiments, another advantage of the present invention is that it can be used with conventional photolithography equipment (equipment which is capable of using standard conventional photolithography masks). These conventional masks can be replaced by the photolithography masks of the present invention to generate the desired pattern on-demand. This way, the layout of the pattern can be modified on demand and can be modified from one device to the next. This has great interest in device development where process tuning and design tuning are necessary. Naturally, the plate can also be dimensioned such that the mask of the present invention can function with any photolithography equipment, even those for use with standard photolithography masks. The additional volume due to added on-board electronics should be small enough to fit into the path clearance used when handling a standard photolithography mask.

As the photolithography mask can be used in place of standard masks in existing photolithography systems, with minor or no modifications, it is a cheap solution to transform an existing photolithography system into a digital photolithography process.

One advantage of the mask of the present invention is that it can create an adaptable stencil instead of a fixed stencil.

As mentioned, other conventional techniques exist where lithography is done using a pulsed scanning beam using photons, electrons or ions. The scanning of the beam and the pulsing of the beam is controlled using different techniques. Those techniques (namely mask-less lithography) have in common that they do not require the fabrication of a physical mask in order to perform the desired pattern transfer through the lithography process. These techniques also have in common the altering of one pixel at a time on the substrate. Therefore, the throughput and resolution are determined by the scanning speed and pulsing control.

In embodiments, the photolithography mask of the present invention has the advantage of setting the pattern at once, and, when exposed to a large beam, the photolithography of the pattern will be performed all at once over the area of the mask. This generates the alteration of all desired pixels at the same moment instead of consecutively. This exposure of the same pattern can be repeated numerous times for the production of the same pattern. This allows large throughput for parallel fabrication (because the same pattern can be repeated on large areas sequentially), compared to in-series fabrication for common mask-less lithography processes (where one pixel at a time is altered). What this also means is that, in embodiments, the mask of the present invention allows repetition of the same pattern where the step that converts the digital file into a usable stencil is done only once. This is like traditional photolithography, but with the advantage of creating an adaptable stencil.

Moreover, maskless photolithography, electron lithography and ion beam lithography techniques require special dedicated equipment and sometimes specific preparation and post-processing of the substrates, whereas the mask of the present invention can be designed to insert itself seamlessly into conventional photolithography procedures.

With the mask of the present invention, the whole surface of the resist can be altered in one operational step.

In embodiments, an advantage of the mask of the present invention is that it allows for a digitally controlled photolithography process which requires little to no modification to standard conventional photolithography procedures, since it can use the same materials, chemicals and, most importantly, equipment. For microfabrication process development, this is a strong financial advantage, because new processes typically require many iterations with many versions of photolithography masks, which can be strong cost drivers and time consuming.

In embodiments, another advantage over existing mask-less lithography is that the mask of the present invention uses the same alignment patterns, the same alignment marks, and the same alignment methods as standard photolithography in the same system. It is therefore easier to implement the mask of the present invention into an existing microfabrication process than implementing a new alignment process. It also has the same placement precision (overlay) as conventional photolithography tools.

As mentioned, the plate of the mask of the present invention can be made of glass (or other materials transparent to the processing photons), and can include an opaque film on a specific area, as with standard photolithography masks, where alignment marks are patterns. They are used to align the layout of the mask, as with standard photolithography masks. However, where standard photolithography masks use permanent opaque patterns on an area, with the mask of the present invention, each pixel can be controlled to be transparent or opaque on request. The activation of transparency or opacity can be controlled by the on-board computer that sets which pixel is activated or not.

In embodiments of the present invention, the opacity to transparency level can be set for each pixel in a controlled manner. In embodiments, the on-board microcontroller is fixed to the plate and contains a micro-processor and digital memory. In preferred embodiments, the photolithography mask of the present invention includes a beam sensor to detect the photon beam and a communication port (cable or wireless) to communicate with a communication system. The communication system transfers the information of what pattern to print and when to print it. The beam sensor detects the beam at every exposure. It allows for the switching of the pattern between each exposure if the communicated instructions are as such. Other examples of instructions can be that pattern "A" will be exposed "X" number of times before pattern "B" is exposed "Y" number of times, etc. In embodiments, the communication system further includes a master controller (as shown in FIG. 5 and as discussed above) that is programmable, and that acts as an interface to communicate the instructions to the digitally controlled mask at the right moment.

The invention is preferably designed and configured to be used in photolithography equipment which uses UV or visible light techniques.

The photolithography process could be used for microfabrication, but it could also be used for roll-to-roll photolithography.

While the photolithography mask of the present invention may require a second or a third exposure to generate the desired pattern, which affects the throughput, this is a minor disadvantage compared to the time required to fabricate a new mask (from a few days, to weeks), especially considering that multiple exposures are sometimes used with current photolithography processes using conventional masks. Multiple exposures with conventional photolithography masks require mask changes and long setup times; in embodiments, the mask of the present invention does not require mask changes and has minimal setup times.

Typically, when using conventional photolithography, each exposure is identical (from the same stencil) and cannot provide separate identification. The photolithography mask of the present invention can be used to produce a unique identification pattern (e.g., a bar code or identification characters) on each die, thereby allowing each replicate (or groups of replicates) to be differentiable from each other. For clarity, various replicates can comprise the same identification pattern (if one wants groups of replicates to be identifiable using an identification pattern) or each replicate can comprise a unique identification pattern (if one wishes for each replicate to be differentiable from the others). The addition of the identification pattern can be done, for example, by adding an additional exposure step following a photolithography step, said additional exposure step being used to add the unique identification pattern. Alternatively, the addition of the identification pattern can be done within the same exposure step, where the pixels that are reserved for the identification pattern are altered at each exposure step and for each individual die.

Figure 20:
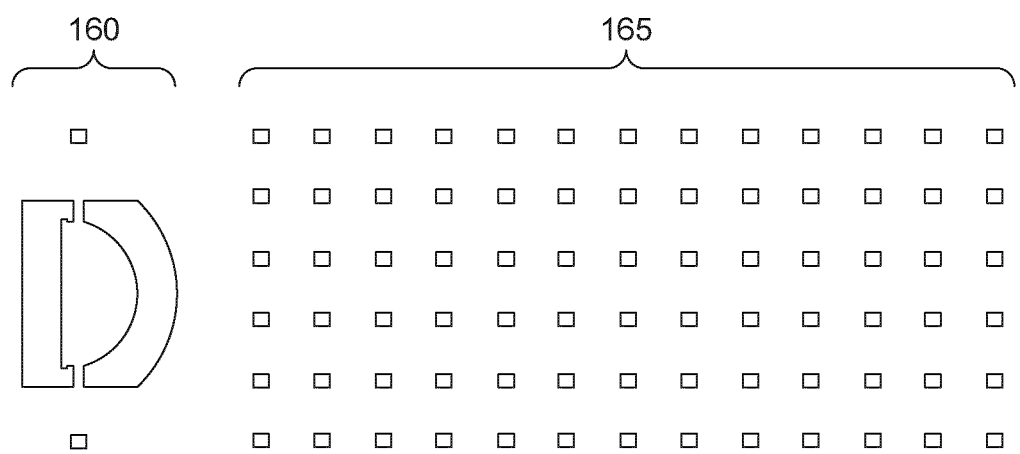
FIG. 20 shows an identification pattern produced by the photolithography mask according to an embodiment of the present invention.

FIG. 20 shows an example of an identification pattern produced by the photolithography mask according to an embodiment of the present invention. As shown in FIG. 20, a reference structure 160 can be used to locate the identification pattern, which in FIG. 20 is a 2D matrix 165 that represents a 2D identification bar code. In FIG. 20, each point on the 2D matrix 165 is either present (ON) or not present (OFF), depending on which pixels of the photolithography mask are actuated.

The scope of the claims should not be limited by the preferred embodiments set forth in the examples, but should be given the broadest interpretation consistent with the description as a whole.

Definitions

The use of the terms "a" and "an" and "the" and similar referents in the context of describing the invention (especially in the context of the following claims) are to be construed to cover both the singular and the plural, unless otherwise indicated herein or clearly contradicted by context.

The terms "comprising", "having", "including", and "containing" are to be construed as open-ended terms (i.e., meaning "including, but not limited to") unless otherwise noted.

Recitation of ranges of values herein are merely intended to serve as a shorthand method of referring individually to each separate value falling within the range, unless otherwise indicated herein, and each separate value is incorporated into the specification as if it were individually recited herein. All subsets of values within the ranges are also incorporated into the specification as if they were individually recited herein.

All methods described herein can be performed in any suitable order unless otherwise indicated herein or otherwise clearly contradicted by context.

The use of any and all examples, or exemplary language (e.g., "such as") provided herein, is intended merely to better illuminate the invention and does not pose a limitation on the scope of the invention unless otherwise claimed.

No language in the specification should be construed as indicating any non-claimed element as essential to the practice of the invention.

Herein, the term "about" has its ordinary meaning. In embodiments, it may mean plus or minus 10% or plus or minus 5% of the numerical value qualified.

Unless otherwise defined, all technical and scientific terms used herein have the same meaning as commonly understood by one of ordinary skill in the art to which this invention belongs.

The invention claimed is:

1. A photolithography mask (10) comprising a plate (15) or an empty frame matrix, a surface of the plate (15) or empty frame matrix comprising an array of micro-pixels (20), wherein each micro-pixel (20) is independently controllable using an on-board micro-controller (25) in such a manner that a pattern can be generated with the array of micro-pixels (20);

wherein each micro-pixel (20) comprises a first film (115) and a second film (120) defining a Fabry-Perot interferometer, wherein the first film (115) and the second film (120) have a higher refractive index than the plate (15), and wherein a distance between the first film (115) and the second film (120) is adjustable in such a manner that transmission through the interferometer is adjustable.

2. The photolithography mask (10) of claim 1, wherein the micro-controller (25) is operatively connected to an exposure sensor (45) for sensing light signals during exposure and transmitting signals to the micro-controller informing if the exposure occurs or not.

3. The photolithography mask (10) of claim 1, further comprising a communication port (40) configured to communicate with a communication port (70) of a communication system (60), said communication system (60) comprising a master controller (65) configured to send a sequence of commands and the pattern to be generated to the on-board micro-controller (25).

4. The photolithography mask (10) of claim 3, wherein the master controller (65) is configured to synchronize actions of the photolithography mask (10) to actions of a photolithography system as per said sequence of commands.

5. The photolithography mask (10) of claim 1, wherein the photolithography mask (10) is dimensioned to be used in conventional photolithography systems.

6. The photolithography mask (10) of claim 1, wherein each Fabry-Perot interferometer is alterable using electrostatic actuation in combination with repelling hinges.

7. The photolithography mask (10) of claim 1, wherein each micro-pixel (20) is an actuatable opaque shutter that is moved laterally when actuated or experiences an off-plane rotation when actuated.

8. The photolithography mask (10) of claim 1, wherein each micro-pixel (20) is MEMS-actuatable.

9. The photolithography mask (10) of claim 1, wherein each micro-pixel (20) is actuatable using electrostatic actuation, piezoelectric actuation, magnetic actuation, pneumatic actuation or bimetal thermal expansion actuation.

10. The photolithography mask (10) of claim 1, wherein each micro-pixel (20) is rectangularly shaped, and each of the length and width of each micro-pixel is at least about 5 nm, at least about 50 nm, at least about 500 nm, at least about 1 micron, at least about 2 microns, or at least about 2.5 microns and/or at most about 500 microns, at most about 100 microns, at most about 50 microns, at most about 20 microns, at most about 10 microns, or at most about 5 microns.

11. The photolithography mask (10) of claim 1, wherein the micro-pixels have the same length and width, such that each micro-pixel is mostly square-shaped.

12. The photolithography mask (10) of claim 1, wherein each micro-pixel has dimensions between about 5 nm×5 nm and about 500 microns×500 microns.

13. The photolithography mask (10) of claim 1, wherein each micro-pixel has dimensions of 1 um×1 um, 2.5 um×2.5 um, or 5 um×5 um.

14. The photolithography mask (10) of claim 1, wherein all micro-pixels in the array have the same dimensions.

15. The photolithography mask (10) of claim 1, wherein the micro-pixels have different and/or the same dimensions as other micro-pixels in the array.

16. The photolithography mask (10) of claim 1, wherein a unique identification pattern can be generated with the array of micro-pixels (20).

17. The photolithography mask (10) of claim 16, wherein the unique identification pattern comprises a 2D matrix (165).

18. A photolithography system comprising the photolithography mask of claim 1.

19. A die comprising a unique identification pattern produced using the photolithography mask of claim 1.

20. A photolithography mask (10) comprising:

a plate (15);

an array of micro-pixels (20) mounted on the plate (15); and on-board micro-controller (25) mounted on the plate, the onboard micro-controller (25) being operatively connected to the array of micro-pixel (20);

wherein each micro-pixel (20) is independently controllable using the on-board micro-controller (25) in such a manner that a pattern can be generated with the array of micro-pixels (20);

wherein each micro-pixel (20) comprises a first film (115) and a second film (120) defining a Fabry-Perot interferometer, wherein the first film (115) and the second film (120) have a higher refractive index than the plate (15), and wherein a distance between the first film (115) and the second film (120) is adjustable in such a manner that transmission through the interferometer is adjustable.

* * * * *